United States Patent [19]

Dillon et al.

[11] Patent Number: 4,758,924
[45] Date of Patent: Jul. 19, 1988

[54] ELECTRONIC EQUIPMENT HOUSING

[75] Inventors: Richard R. Dillon, Wellesley; Helmut H. Henneberg, Canton; Antonio P. S. Soares, Cambridge; Paul S. Yoshida, Newton Highlands, all of Mass.

[73] Assignee: Honeywell Bull Inc., Waltham, Mass.

[21] Appl. No.: 868,408

[22] Filed: May 29, 1986

[51] Int. Cl.$^4$ .......................... H05K 7/20; H02B 1/20
[52] U.S. Cl. ..................................... 361/383; 361/384; 361/399; 361/428
[58] Field of Search .................... 339/18 R, 34, 36; 361/383–384, 390, 394, 395, 399, 415, 424, 428

[56] References Cited

U.S. PATENT DOCUMENTS

| 546,802 | 9/1895 | Mather et al. | 361/424 |
| 2,077,160 | 4/1937 | Wilson | 361/390 |
| 2,704,301 | 3/1955 | Feketics | 361/424 |
| 3,001,102 | 9/1961 | Stiefel et al. | 361/390 |
| 3,147,404 | 9/1964 | Sinner | 361/390 |
| 3,184,645 | 5/1965 | Schaeffer | 361/390 |
| 3,371,975 | 3/1968 | Meltzer | 361/384 |
| 3,904,936 | 9/1975 | Hamrick et al. | 339/34 |
| 4,160,880 | 7/1979 | Brey | 339/18 R |

FOREIGN PATENT DOCUMENTS

| 0601044 | 7/1934 | Fed. Rep. of Germany | 361/428 |
| 0391762 | 11/1973 | U.S.S.R. | 361/424 |

Primary Examiner—A. D. Pellinen
Assistant Examiner—Gregory D. Thompson
Attorney, Agent, or Firm—Faith F. Driscoll; John S. Solakian

[57] ABSTRACT

An electronic equipment housing provides easy access to electronic equipment via a hinged top panel and a clear plastic safety panel below it. Inside the housing are cable raceways located at the top front and top rear which are in line with raceways in adjacent housings to permit many cables to be contained inside the housings. The raceways and cables are positioned so as not to interfere with convection cooling inside the housings and with access to the equipment. Relatively high heat generating equipment such as power supplies are mounted to one side of the interior of the housing enabling separate fans to cool the power supplies using a single flow of air while other equipment in the housing is cooled by a separate flow of air drawn by other fans. Common system equipment is enclosed in the housing located at a predetermined one end of a series of adjacent housings. The common housing has a side mounted connector arrangement, with the connectors being mounted on swing out doors or bulkheads for ease of access. The connectors are organized to accommodate cables coming from other adjacent housings to the connectors which have the same length cables. The front and rear panels on all housings have horizontal slots that permit cooling air flow for cooling, and conductive screening behind the slots for minimizing radio frequency interference (RFI). In addition, the top, front and side removable panels have gaskets to suppress RFI signals.

12 Claims, 5 Drawing Sheets

ELECTRONIC EQUIPMENT HOUSING

BACKGROUND

1. Field of the Invention

This invention relates to packaging for electronic circuitry and more particularly to housings for packaging electronic equipment.

2. Background of the Invention

In the prior art, electronic computer circuitry and equipment have typically been packaged in metal housings or enclosures, different sides or panels of which are removable to gain access to the circuits and equipment in the interior of the housing. Alternatively, an entire housing cover is removed as a single piece from the top of the equipment housing to gain access to the circuits and other equipment inside.

Power and signal cables to and between a group of housings in a computer system typically connect to connectors mounted at the rear of the housings. Various switches are also located on the rear of the housings. Access to and removal of printed circuit (PC) cards and other modules such as power supplies, disk drives, and fans are typically achieved by the removal of a front panel of such housings.

There are many shortcomings with these prior art electronic equipment housings. For example, the rear housing cabling arrangement normally requires that the housings be spaced far enough from a wall to provide room for the cables, and so that access may be had to the cables and switches at the rear of the housings. This creates unused floor space that can add to certain inefficiencies. In addition, the cables normally situated on the floor behind the housings create certain hazards. The problem is made worse by the fact that the cables are usually made to a standard length and typically too long, thus requiring that the excess cabling be coiled or just lie in disarray.

To minimize the wasted floor space, the equipment is sometimes located as close to the wall as possible. This has been found to create another problem of access to the cables and their connectors, switches and even the rear of housing accessed interior components. In such arrangements, to gain working access to the rear of the housings, the equipment must be temporarily moved further away from the wall which often creates other problems such as inadvertently disconnecting and/or damaging connectors.

Access to printed circuit cards and other equipment through the front of a housing may be accomplished by removing its front panel if the housing is relatively high so that the interior can be accessed by a person while standing up. However, many modern housings are only two to three feet high. The result is that a person must assume a prone position to view the interior of the housing and to remove printed circuit cards and other modules therefrom. This has been found to be both inefficient and inconvenient.

Another problem with some prior art housings is that printed circuit cards containing temperature sensitive components are sometimes mounted adjacent to heat generating equipment such as power supplies. Thus, the same cooling air is circulated over the printed circuit cards and the high heat generating component such as the power supplies. Where the air passes over the printed circuit cards first, the air is warmed before reaching components such as power supplies resulting in decreased cooling effect. To compensate for such cooling inefficiencies, either larger fans are used which require more space and use more power, or the maximum temperature of the room in which the equipment is located is lowered.

Thus, there is a need in the prior art for an electronic equipment housing which can be located close to a wall to conserve floor space. In addition, there is a need for a way to more conveniently access printed circuit cards and most other equipment in the housing. Moreover, there is a need for a cabling arrangement which can minimize exterior cabling which still permits the use of standard length cables. Further, there is a need for an equipment arrangement in the housings that permits adequate cooling via convection and with the smallest possible cooling fans.

SUMMARY OF THE INVENTION

The aforementioned needs of the prior art are met by the modular electronic equipment housings of the present invention. The modular housing arrangement of the present invention permits the positioning of housings contiguous to each other in a computer system configuration, by simply removing the sides of the housings that are to be positioned adjacent to each other. The tops of each of these housings are hinged, thereby allowing for easy top access to vertically mounted printed circuit boards and other electronic components inside the housings.

Common system electronic equipment such as disk drives and most input/output cable interfaces are mounted in a common equipment housing, while printed circuit cards containing computer circuitry such as processors and memory are mounted in a different housing.

No cabling between individual ones of the novel housings lies on the floor behind the housings. AC power cables and some communication cables are located at the rear of and enter the housings through a cutaway. Also, cables to peripheral equipment such as printers are located at the rear of and enter the common equipment housing through a cutaway. This housing is located at one end of a row of housings in a system configuration. This arrangement simplifies access to peripheral equipment cable connections.

Inside each PC card housing, there are cable raceways positioned parallel to the front panel and located at the top front and at the top rear of the housing. With housing side panels removed between contiguous PC card housings, the cable raceways in the housings are positioned to be coaxially aligned. Cables between circuits and other components inside the PC card housings and the common equipment housing are placed in these interior cable raceways. The cable raceways are positioned so that the cables therein do not interfere with convection cooling of the printed circuit boards and other electronic components, the flow of air from cooling fans, and with access to these PC cards and other components from the hinged top panel of the equipment housings.

Input and output signal cables all connect to a bulkhead connector array located at one side of the common equipment housing. The bulkhead is divided into a plurality of swing out sections. The connectors are mounted on these swing out sections or doors that permit easy access to change or reposition connectors or bulkhead sections and interior wiring. In addition, the connectors are organized in an arrangement that permits the connecting cables from any one of the adjacent housings to be of a standard length and not require coiling due to excess cable.

In PC card housings, the power supplies for the PC cards are mounted to one side of the housing. Fans are located to cool the power supplies and the printed circuit cards, by drawing air through horizontal slots contained in the front panel of the housing which exits through similar horizontal slots contained in the rear panel of the housing. In this arrangement, the air which passes over either the printed circuit cards or the power supplies does not pass over other components, so maximum cooling is achieved.

The horizontal slots through the front and rear panels of the housings have conductive screening positioned behind and across them to minimize radio frequency interference (RFI) signals escaping from the interiors of the housings. In addition, the housings and the removable panels including the hinged housing top are painted with a conductive paint. All removable or opening panels have conductive seals, conventional in design, mounted thereon which contact the conductive paint to further minimize RFI signals from escaping from the housings.

BRIEF DESCRIPTION OF THE DRAWINGS

The invention will be better understood upon reading the following detailed description in conjunction with the following drawings.

DETAILED DESCRIPTION OF THE PREFERRED EMBODIMENT

Figure 1:
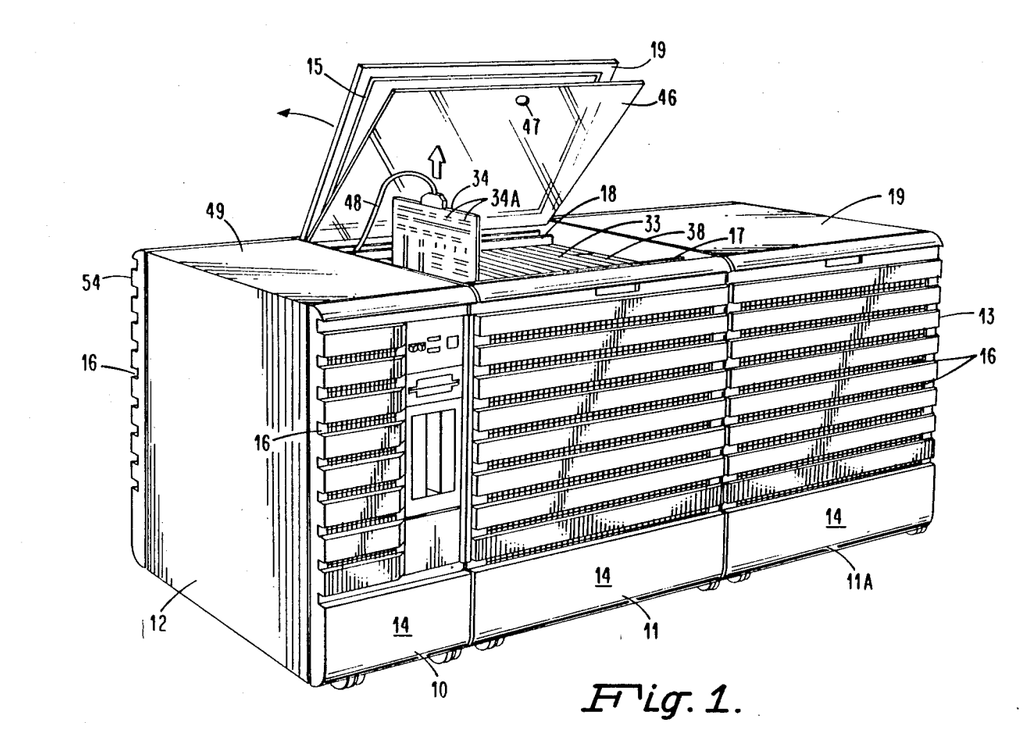
FIG. 1 illustrates a three-dimensional view of modular housings constructed in accordance with the teaching of the present invention in which one housing has its hinged top open.

In FIG. 1 is shown a three dimensional view of a typical common housing 10 and two adjacent printed circuit card housings 11 and 11A. In a small system configuration, there is one housing 10 and one housing 11. In larger system configurations there are more housings 11, of which only one such extra housing 11A is shown in FIG. 1.

Housing 10 has a latched lift-off top cover 49 that can be easily opened to gain access to the interior of housing 10. Housings 11 and 11A have a hinged top cover 19 and underneath that a clear plastic cover 46. Housing 11 is shown with its hinged metal top 19 and its internal hinged clear plastic top cover 46 open, with an exemplary printed circuit card 34 shown partially removed. Hinged top 19 is equipped with a mechanism (not shown) that permits it when opened to remain opened by itself, without the need for a support arm, until top 19 is closed.

Card 34 connects to a cable 48 via an edge connector which is normally disconnected before card 34 is removed. Around the bottom side of hinged top cover 19 is an RFI gasket 15 which makes a good RFI seal with the top edges of housing 11 when top 19 is closed. To assist in RFI sealing, and with RFI suppression generally, the housings are all painted inside with a conductive paint. Front panels 14 as shown are mounted on the front of housings 10, 11 and 11A. The panels are easily removed to gain access to electrical components, such as fans, that need infrequent maintenance or replacement. These components are better shown in FIG. 2b.

Housings 10, 11, and 11A all have removable side panels. Each has a front panel 14, a left side panel 12, a right side panel 13, and a rear panel 54. When two housings are mounted adjacent to each other the side panels 12 and 13 between them are removed, and the housings are bolted together in a conventional manner.

In the configuration of FIG. 1, the left side panels 12 have been removed from housings 11 and 11A, and the right side panels 13 have been removed from housings 10 and 11. This leaves left side panel 12 on housing 10 and right side panel 13 on housing 11A, as shown. As discussed herein, this permits inter-housing cables to be positioned within the internal cable raceways 17 and 18 contained inside housings 10, 11, and 11A.

Figure 2A:
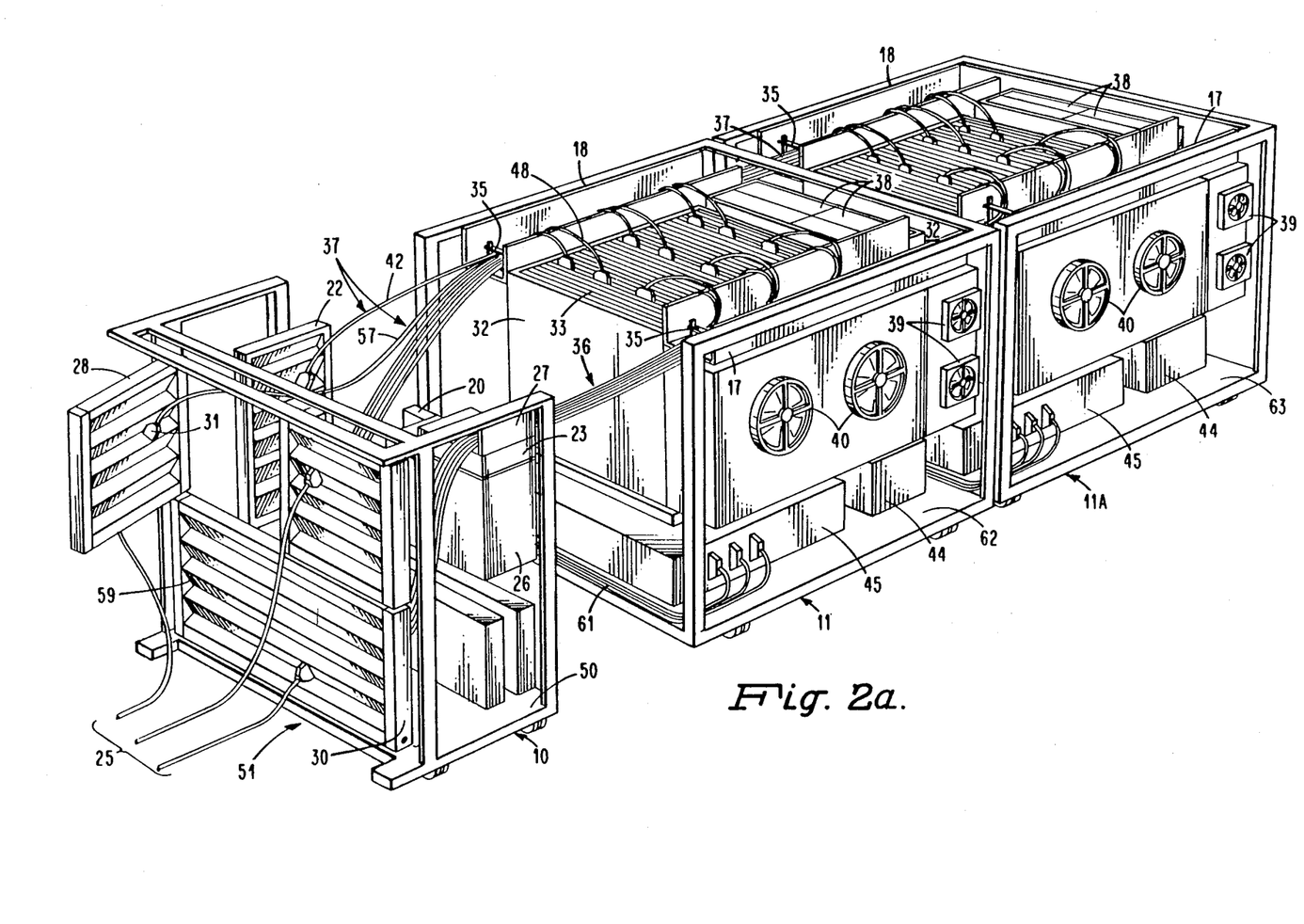
FIGS. 2a and 2b shown the interior of the two basic types of equipment packaging housings constructed in accordance with the teaching of the invention with and without the frame structure.
Figure 2B:
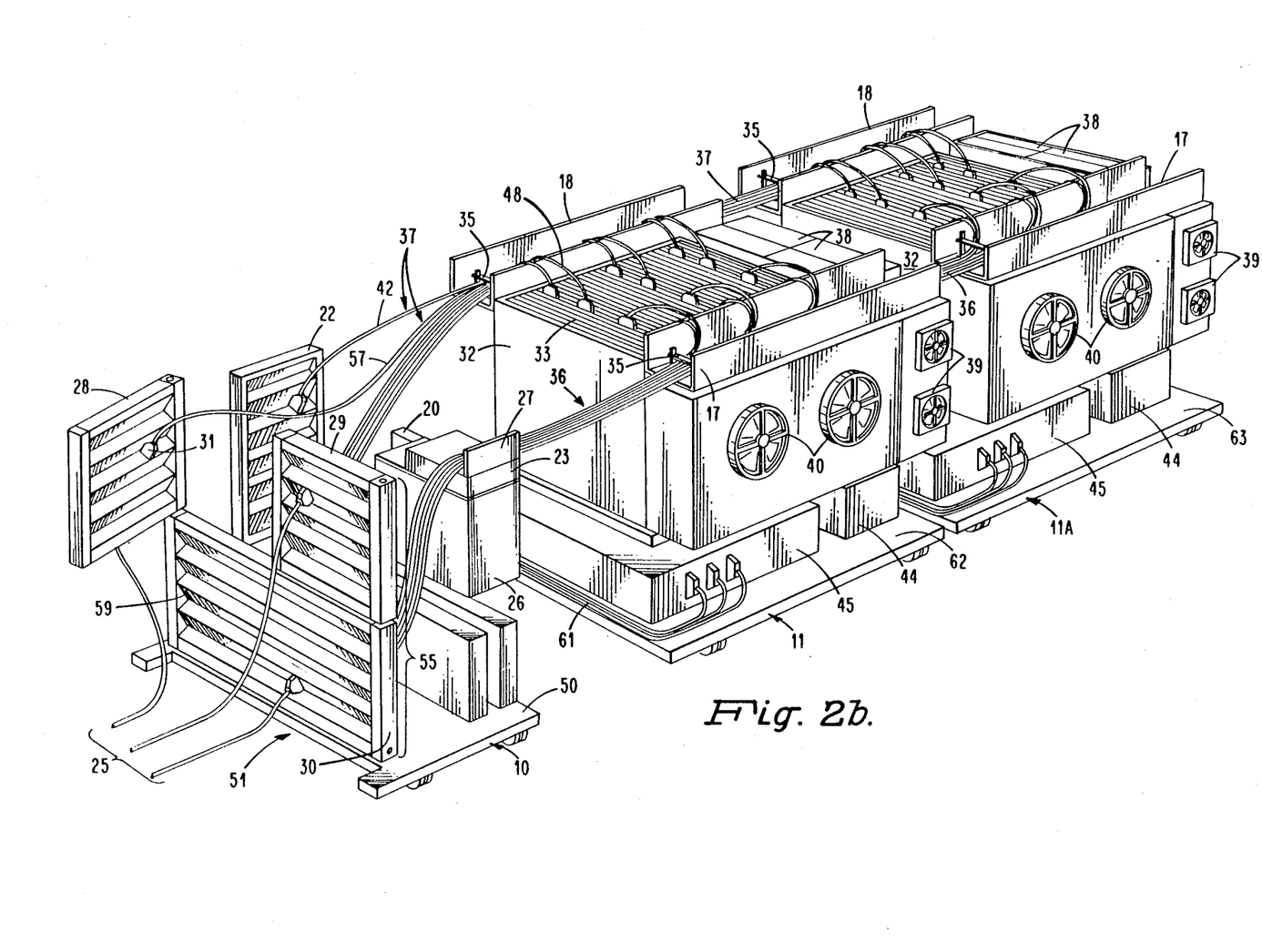

Left side panel 12 on housing 10 encloses a bulkhead connector interface 55 shown in detail in FIG. 2b. As discussed herein, interface 55 is where cables 25 with connectors entering housing 10 connect to mating connectors on the cables that are distributed to housings 10, 11, and 11A.

Located around the underside of each of the hinged housing tops 19 of housings 11 and 11A there is RFI gasket 15 which makes an RFI seal with the top of housings 11 and 11A to minimize RFI emissions when the tops 19 are closed. Similarly, located around the inside edge of front panel 14, right side panel 13, left side panel 12, and rear panel 54 of housings 10, 11, and 11A there are also RFI seals (not shown) which make an RFI seal respectively with the front, left, right and rear sides of the housings when they are fastened to the housings. When housings 10, 11, 11A are bolted together with some of their side panels 12 and 13 removed, as described above, there is still an RFI tight seal. As mentioned above, no further aid in the RFI suppression, the interiors of all of the housings 10, 11, and 11A, including their tops 19 and sides 12, 13, 14 and 54 are painted with a conductive paint.

Inside housings 11 and 11A are two cable raceways 17 and 18 as shown. Cable raceway 17 is located at the top front of housing 11 and parallel to the front of the housing. Cable raceway 18 is located at the top rear of housing 11 and also parallel to the front of the housing. When two or more housings 11 and 11A are bolted together without side panels 12 and 13 between them in the computer system configuration of FIG. 1, the top front cable raceways 17 in adjacent housings 11 and 11A are placed in coaxial alignment with each other. Similarly, the top rear cable raceways 18 in adjacent housings 11 and 11A are placed in coaxial alignment with each other. This provides front and rear cable paths for inter-housing sets of cables 36 and 37 as shown in FIG. 2b) to and between the printed circuit cards 33 and 34 and other components such as power supplies 38 inside the adjacent housings 10, 11 and 11A that are completely enclosed. This arrangement provides easy cable access to the inter-housing cables without having to go behind the housings 10, 11 and 11A. In addition, by having the inter-housing sets of cables 36 and 37 located inside of the housings 10, 11, and 11A not only are the number of cables positioned behind housings 10, 11 and 11A minimized but, importantly, these sets of cables 36 and 37 are shielded by being placed inside the housings 10, 11 and 11A thereby providing additional suppression of RFI signals caused by signals on the wires within the cables.

Also located inside the top of housings 11 and 11A, underneath hinged top cover 19, is a safety top cover 46 which is made of clear plastic. Top cover 46 is equipped with a conventional tool operated lock which is installed into a hole 47. Only maintenance personnel have a key to open plastic top cover 46 for maintenance purposes such as removing PC cards 33 and power supplies 38. Other non-maintenance personnel are thereby excluded from gaining access to the electronics for safety purposes since there are exposed terminals with voltages thereon. However, the non-maintenance personnel are able to see various operational status lights 34 beneath the clear plastic cover 46.

Front panels 14 have a plurality of horizontal slots 16 on the front of housings 10, 11 and 11A. Behind the slots 16 is a conductive screen depicted by a grid pattern in FIG. 1 which provides RFI shielding. Similarly, there are slots 16 through rear panels 54 on the rear of housings 10, 11 and 11A which are also RFI shielded by conductive screening. These horizontal front and rear slots 16 provide a passage for air to be drawn in through the front slots 16 and out through the rear slots 16 which cool the printed circuit boards 33 and other electrical components such as power supplies located inside of housings 10, 11 and 11A.

FIGS. 2a and 2b are three dimensional views of the interior elements of adjacent equipment housings 10, 11 and 11A. Only the three housings are shown in FIGS. 2a and 2b, but any number of housings may be bolted together depending upon the particular computer system configuration. Also, only two types of representative housings 10 and 11 are shown, but those skilled in the art can mount other types of electronic equipment in the housing in accordance with teaching of the present invention.

Figure 3:
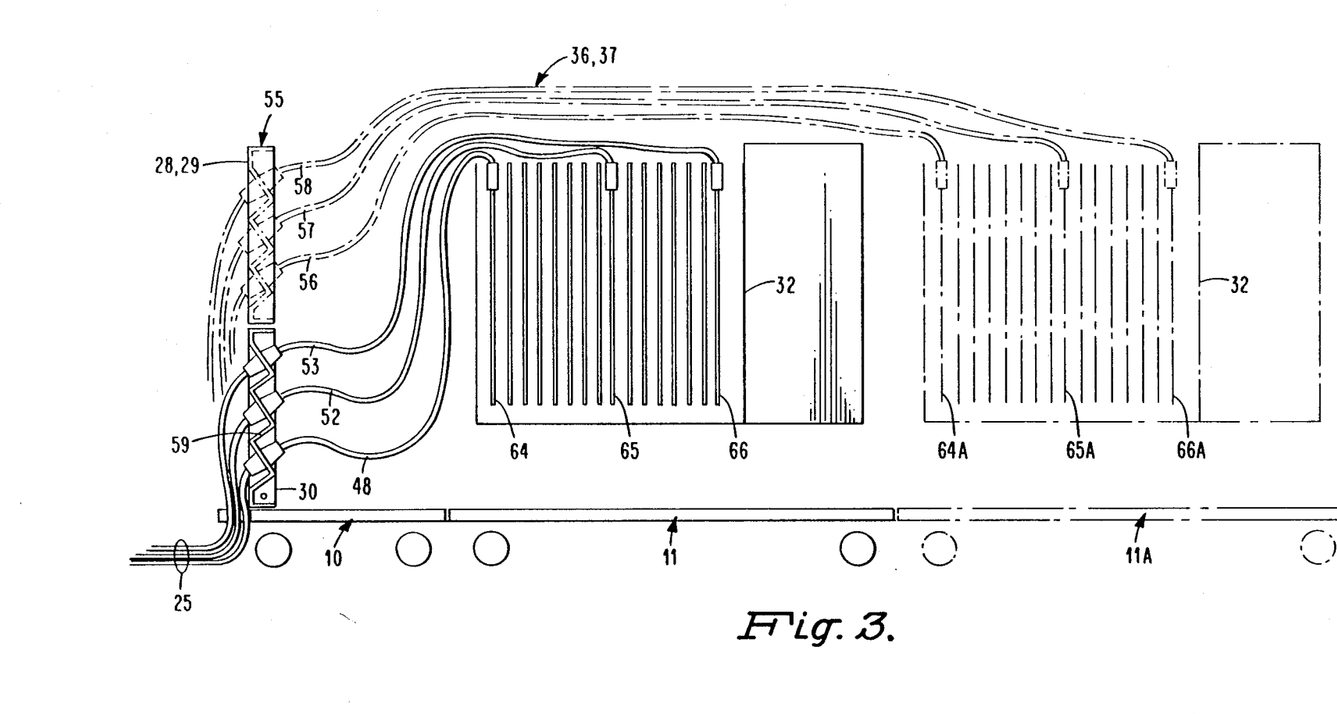
FIG. 3 shows the organization of the cables in the cable raceways, and the bulkhead connector interface that permits the use of standard cable lengths for connecting equipment contained in each housing to the connector interface.

The frame structure, the hinged housing top 19, and left, right, front, and rear panels 12, 13, 14, and 54 have been removed from housings 10, 11, and 11A in FIG. 2b so that other details of the electronic equipment housing arrangement of the present invention may be seen. While the mechanical parts of housings 10, 11, and 11A as described above with reference to FIG. 1 are basically the same, there are some differences other than those described with reference to FIG. 1. For example, inside housings 11 and 11A are mounted, printed circuit card trays or containers 32, cooling fans 39 and 40, and power supplies 38. Inside housing 10 are mounted common system components such as a floppy disk drive 23, an operators panel 27, a power supply 20, a tape unit 26 containing tape cartridges to back up daily transactions processed by the computer system, and a bulkhead connector interface 55. Interface 55 shown in greater detail in FIG. 3, provides cables 25 to mating connectors attached to cables 36 and 37 which are connected to the circuits and other components inside housings 10, 11 and 11A.

Bulkhead connector interface 55 is divided into three swing out doors or bulkhead sections 28, 29 and 30. Door or section 28 is hinged and swings out to the left as shown, while section or door 29 is hinged at its right edge and swings out to the right. The larger section or door 30 is hinged and swings out and down. As mentioned previously, these swing-out doors or bulkhead sections 28, 29 and 30 permit access to the connectors on cables 36 and 37 to change them, move them, or to change cable wiring to them. In a small system configuration, only swing-out door or section 30 is utilized. For larger system configurations swing-out doors or sections 28 and 29 are added as required to handle additional cable connector connections.

As shown in FIG. 2b, each of the swing-out doors 28, 29 and 30 has a surface that is saw-tooth in shape. This saw-tooth shape creates a number of surfaces 59 which are angled to face downward on the outside of doors 28, 29 and 30. Through these surfaces 59, are punched rows of cutouts designed to latch and hold connectors on the ends of cables in the set of cables 36 and 37, such as exemplary cable. With the connector 31 on the end of cable 57 latched to a surface 59, cable 57 bends upward over the top of the equipment inside of housing 10. Similarly, the angle of surfaces 59 causes those cables 25 connected to connectors, such as connector 31, which are latched at surface 59 to bend downward.

Cables 25 enter and exit housing 10 via a cutback or notched portion 51 at the edge of base pan 50 of housing 10. When left side panel 12 is installed on housing 10, connector interface 55 cannot be seen. The result of using angled surfaces 59 as cable connector interface 55 insures that there are no sharp bends in cables 25, 36 or 37. An example of latching connector housings that latch to cutouts through surfaces 59 and latch to housings containing connectors of cables 25 is disclosed in U.S. Pat. No. 4,634,203, issued Jan. 6, 1987.

In addition, a rear swing-out door 22 or bulkhead section is provided at the rear of common equipment housing 10 for connecting cables to and from peripheral equipment (not shown), such as a printer, to electronic equipment inside housings 10, 11, and 11A. Cable 42 included in the set of cables 37 is shown connected to the inner side of bulkhead door 22. Bulkhead door 22 discussed herein in greater detail with reference to FIG. 4 and is assembled in the manner same as doors 28, 29 and 30.

Figure 4:
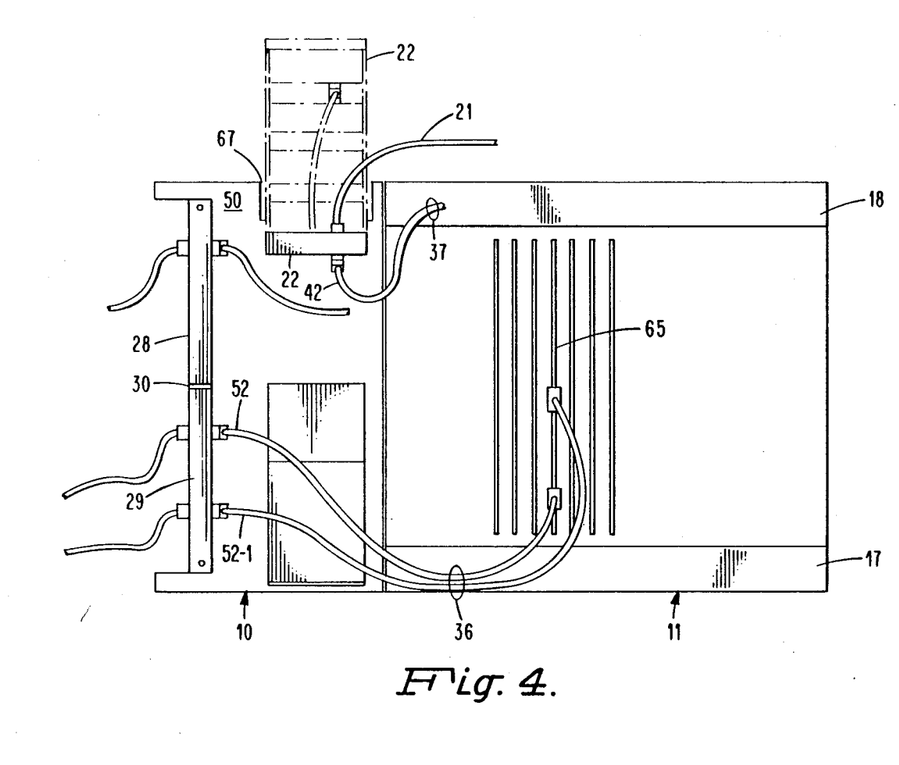
FIG. 4 is a top view of cables internal to the housings going to the bulkhead connector interface and to a swing out auxiliary bulkhead connector interface at the rear of the common equipment housing for connecting cables from peripheral equipment.

Base pan 50 of common equipment housing 10 also has a second notched or cutback 67 on its rear edge shown in FIG. 4. Cables from peripheral equipment such as printers enter housing 10 behind the removable rear panel 54 through cutback 67 and connect to mating connectors latched to the auxiliary bulkhead section connector door or bulkhead 22.

Housings 11 and 11A are of identical construction and are used to house vertically mounted printed circuit (PC) card trays 32 into which are inserted PC cards 33. Printed circuit card trays 32 include plastic edge guides (not shown) that bind the edge of the cards to prevent them from accidentally slidding down into the card tray and damaging the cards and the connectors located at the bottom of trays 32.

As discussed earlier each of housings 11 and 11A include the cable raceways 17 and 18. The front cable raceway 17 and the rear cable raceway 18 in each of the housings 11 and 11A are positioned in coaxial alignment with each other when housings 11 and 11A are arranged contiguous to each other as shown. As previously mentioned, when two housings 11 and 11A are bolted together in a given system configuration, they have no side panels 12 and 13 between them. This allows the sets of cables 36 located in front cable raceways 17 and the set of cables 37 located in rear cable raceways 18 to pass unimpeded between housings 10, 11 and 11A as shown. The position of cable raceways 17 and 18 in housings 11 and 11A, and the sets of cables 36 and 37 therein, do not interfere with insertion or removal of PC cards 33 and 34 in or from PC card trays 32. Raceways 17 and 18 also do not interfere with the flow of fan blown cooling air through PC cards 33. In cable raceways 17 and 18, are mounted cable clamps 35 that are used to hold the cables included within the set of cables 36 and 37 in the raceways, yet let them fan out to the printed circuit cards 33 in card tray 32.

In housings 11 and 11A, those cables of the sets of cables 36 and 37 connecting to a particular PC card 33 fan out from cable raceways 17 and 18 and the cable clamps 35 therein generally in line with a particular PC card 33. In this way, the cables do not interfere with other PC cards, and particularly the insertion or removal of same. Those cables that connect to a particular PC card 33 have PC edge connectors mount thereon that plug onto the edge of the particular PC card in a manner well known in the art. When it desired to remove a PC card, the edge connectors are unplugged and the PC card is withdrawn vertically, as shown for PC card 34 in FIG. 1. This organization of cable raceways 17 and 18 and cables 36 and 37 therein does not interfere with any of the PC cards 33.

Power supplies 38 which supply power to PC cards 33 in each of housings 11 and 11A are located to the right side of the inside of the housings as shown in FIGS. 1, 2a and 2b. Power supplies 38 are mounted vertically which enable them to be also accessed for maintenance and replacement by lifting hinged top 19, and safety cover 46 on each of housings 11 and 11A.

Air circulating fans 39 and 40 are mounted to the front of housings 11 and 11A as shown in FIG. 26 to provide cooling air respectively to power supplies 38 and the printed circuit cards 33. Fans 39 pull air in through the slots 16 in the front panel 14 of FIG. 1) of housings 11 and 11A, which passes over the power supplies 38 to cool them, and exits the inside of housings 11 and 11A by the slots 16 through the rear panel 54 of FIG. 1. Fans 40 pull air in through the horizontal slots 16 in the front panel 14 of FIG. 1 of housings 11 and 11A which passes through the PC cards 33 to cool them, and exits the inside of housings 11 and 11A via the slots 16 through the rear panel 54 of FIG. 1. With this configuration, the same air is not used to cool both power supplies 38 and PC cards 33 as in the prior art. To access the cooling fans 39 and 40 the front panel 14 of FIG. 1 is removed. Since, cooling fans very seldom need replacement, there is little inconvenience of having to access housings 11 and 11A through front panel 14.

At the bottom of the inside of housings 11 and 11A are located power distribution units 44 which distribute AC power to the power supplies 38 and other equipment, such as fans 39 and 40. Also located at the bottom of the inside of housings 11 and 11A, is a flap chassis 45 to which the connectors of special cables 61 connect. These special cables 61 and an AC power cable (not shown) enter the rear of the housings 11 and 11A through a cutback (not shown) located on the rear edge of base pan 62 and 63 respectively like cutbacks 51 and 67 on base 50 of housing 10.

FIG. 3 shows in a diagrammatic form a front view of housings 10, 11 and 11A with inter-housing sets of cables 36 and 37 going from PC cards 33 in card trays 32 to swing-out doors 28, 29 and 30 of bulkhead connector interface 55 in housing 10. In this Figure, the door or section 28 is located behind door section 29 as can be seen from FIG. 2b. Normally the sets of cables 36 and 37 lie in the cable raceways 17 and 18, but they are shown in an elevated position in FIG. 3 to aid in understanding the cabling arrangement of the present invention.

It can be seen that cable 48 is connected between PC card 64 in housing 11 which is located closest to connector interface 55 to one of the angled surfaces 59 at the lowest level of seing out door 30. Cable 53 is connected between PC card 66 located in housing 11 farthest from connector interface 55 to one of the angled surfaces 59 at the highest level of swing out door 30. Cable 52 is connected between an intermediate PC card 65 in housing 11 to one of the angled surfaces 59 at a middle level of swing out door 30. Cable 52 is latched to the middle level surface 59 of swing-out door 30 because of the distance of its other end from housing 10.

This cable arrangement allows for one length of cable to be used between housing 11 and door 30 of connector interface 55 in housing 10. FIG. 3 illustrates previously described angular orientation of the connectors on the ends of sets of cables 36 and 37 latched to the inner side of doors 28, 29 and 30 of connector interface 55, and of the connectors on the ends of cables 25 external to housing 10 mated to cables 36 and 37.

It can be seen in FIG. 3 that cables 56, 57 and 58 of the sets of cables 36 and 37 going from PC cards 64A, 65A and 66A of housing 11A to doors 28 and 29 of bulkhead connector interface 55 in housing 10 are similarly arranged.

FIG. 4 shows a top view of the cabling arrangement of the sets of cables 36 and 37 inside housings 10 and 11. It is seen how exemplary cables 63 and 64 edge connect between a PC card 65 and a mating connection through swing out door 30 of connector interface 55. In FIG. 4, door 30 is located below doors 28 and 29 and therefore, only a very small part is visible. Cables 52 and 52-1 and all other inter-housing cables terminating in housing 11 are of the same length as mentioned previously. The cable 52-1 which has a connector on one end located close to the center or middle of PC card 65 has its other end connected or mated to door 30 at the bulkhead position located closest to the front of housing 10. The cable 52 which has a connector on the end located closest to the front edge of PC card 65 has its other end mated to door 30 at a bulkhead position located further toward the rear or housing 10. Thus, the arrangement provides substantially equal distribution of cable lengths so that each cable, has a similar amount of managable cable, excess. Although this cable arrangement is only shown with a couple of representative cables, it applies to all of the cables included within inter-housing sets of cables 36 and 37.

By coupling the previously described routing of inter-housing sets of cables 36 and 37 to swing out doors 28, 29 and 30, as described with reference to FIGS. 3 and 4 as a function of which cable raceway they are in and where on a PC card they connect, the result is that one length cable may be used for all cables from one of housings 11 or 11A without the problem of excess cable length.

Returning to FIG. 4, swing-out auxiliary connector bulkhead 22 is shown in its normal vertical position by solid lines, and shown in its swing-out position by dotted lines. As previously described, door 22 is used for making cabling connections to peripheral equipment. Thus, cable 21 from a piece of peripheral equipment such as a printer and connects via bulkhead 22 to cable 42 which connects to circuitry internal to housings 11 or 11A that will transmit or receive signals to or from the peripheral equipment. When bulkhead 22 is in its swing-out position, the connector on cable 42 can easily be accessed to move the connector or to change wiring therein. Also shown in FIG. 4 is cutout 67 located at the rear edge of base pan 50 of housing 10 through which cables to/from peripheral equipment pass.

While what has been described hereinabove is the preferred embodiment of the invention, it will be obvious to those skilled in the art that numerous changes may be made without departing from the spirit and scope of the invention. For example, the cooling fans may be mounted at the rear of the housing instead of the front to improve noise silencing. Also, different equipment arrangements may be used inside the housings. In addition, protrusions may be spaced along the top edge of the cable raceways to help position cables as they exit the raceway to edge connect to PC cards.

What is claimed is:

1. A low profile electronic equipment housing having a basic housing frame with a bottom pan and left, right, front and rear removable panels, said front and rear panels having slots therethrough for permitting a flow of air over electronic equipment mounted inside said equipment housing, said housing further comprising:
   a hinged top cover mounted on the top of said housing frame to permit access to said electronic equipment, and
   a number of U-shaped cable raceway members mounted to the inside of said frame adjacent to the top of said equipment housing, said cable raceway members being positioned such that when another similarly constructed equipment housing including frame and cable raceway members is located adjacent to said equipment housing with the side panels of each said housing therebetween removed, said cable raceway members in said housings are coaxially aligned with each other providing a common path for cables connected to and between said electronic equipment mounted inside said equipment housing and in said another equipment housing to a common bulkhead structure, and said raceway members being positioned to hold said cables so that they do not interfere with access to said electronic equipment and said flow of air through said equipment housing used to cool said electronic equipment.

2. The electronic equipment housing of claim 1 further comprising:
   a hinged clear plastic safety cover located underneath said hinged top cover for permitting visual observation of said electronic equipment by an operator but at the same time restricting access to said equipment housing.

3. The electronic equipment housing of claim 1 wherein said electronic equipment includes a plurality of printed circuit cards and wherein said equipment housing further comprises:
   a vertical printed circuit card tray included within said equipment housing for retaining said printed circuit cards vertically positioned inside said tray, said cards being accessed from said equipment housing by opening said hinged top cover, and without interference from said cables which are held in said cable raceway members.

4. The electronic equipment housing of claim 3 wherein said equipment further includes power supplies,
   said power supplies being vertically positioned as part of said tray at a predetermined location which is accessible by opening said hinged top cover and which restricts the generation of heat to one side of the interior of said equipment housing, enabling said flow of air passing through said slots of said front panel of said equipment housing to pass only over said power supplies.

5. The electronic equipment housing of claim 4 further comprising:
   conductive screening mounted behind said slots inside said front and rear panels for suppressing radio frequency interference signals.

6. The electronic equipment housing of claim 5 further comprising:
   means for suppressing unwanted emissions generated by said electronic equipment, said suppressing means being mounted on the inside said top cover to inhibit said emissions when closed.

7. The electronic equipment housing of claim 6 wherein said number of cable raceway members comprises:
   a first U-shaped cable raceway member mounted to said frame inside and parallel to the front of said equipment housing and positioned at the top front;
   a second U-shaped cable raceway member mounted to said frame inside and parallel to the front of said equipment housing and positioned at the top rear; and,
   cable guide means connected to said first and said second raceway members for positioning said cables exiting each of said raceway members for connection at one end to said printed circuit cards vertically mounted in said printed circuit card tray and at the other end to other electronic equipment are accessible for insertion and removal without interference from cables connected to other cards mounted in said card tray or connected to said other equipment mounted in said equipment housing.

8. A low profile electronic equipment housing having a basic housing frame with a bottom pan, left, right, front and rear removable panels, said front and rear panels having slots therethrough for permitting the flow of cooling air over electronic equipment including a plurality of printed circuit cards mounted inside said housing, said housing further comprising:
   a hinged top cover mounted on the top of said housing frame, said top panel being opened to permit access to electronic equipment inside of the housing;
   a vertical printed circuit card tray included within said equipment housing for retaining said plurality of printed circuit cards vertically positioned within said tray so as to appear accessible by an operator when said hinged top cover is opened, said printed circuit cards including indicator lights; and,
   a hinged latched clear plastic safety cover positioned underneath said hinged top cover, said safety cover permitting said operator to observe said indicator lights while restricting access thereto.

9. A low profile electronic equipment housing having a basic housing frame with a bottom pan and having left, right, front and rear removable panels, said front and rear panels having slots therethrough for enabling a flow of air over electronic equipment mounted inside said housing, said housing further comprising:

a connector bulkhead fastened to a bottom pan of another housing frame for permitting external cable access to said electronic equipment mounted inside said housing, said bulkhead interface including a plurality of hinged swing out sections, each section including a number of cutouts for receiving a corresponding number of connectors for ease of access in changing said connectors and said connectors being located within at least a predetermined one of said sections so as to enable the equal distribution of excess cable length in cables of the same standard length which connect through said connectors to said bulkhead and to said electronic equipment located in said housing.

10. A system having a number of abutting low profile electronic equipment housings for enclosing the different units which comprise the electronic equipment of said system, each housing having a basic housing frame with a bottom pan, left, right, front and rear removable panels, said front and rear panels having slots therethrough for permitting the flow of cooling air over said units of electronic equipment mounted therein, each of said housings further comprising:

a hinged top cover mounted on the top of each said equipment housing frame to permit access to said electronic equipment, and     first and second U-shaped cable raceway members mounted to inside portions of the front and rear parts of said frame adjacent to the top of each said equipment housing, said cable raceway members being positioned such that in an abutting equipment housing located adjacent to each said equipment housing with the side panels of each said equipment housing therebetween removed, said cable raceway members in said equipment housings are coaxially aligned with each other providing a common path for internal cables connected to and between said electronic equipment mounted inside said equipment housings to a common bulkhead structure positioned adjacent to a predetermined one of said number of abutting equipment housings, and said first and second raceway members within said equipment housings being positioned to hold evenly distributed numbers of said internal cables so that they do not interfere with said excess to said electronic equipment and said flow of air through said housings enabling sufficient cooling of said electronic equipment.

11. The system of claim 10 wherein said number of abutting equipment housings of said system further includes a low profile common equipment housing having a basic housing frame with a bottom pan, top, left, right, front and rear removable panels, said front and rear panels having slots therethrough for permitting the flow of air, said common equipment housing being positioned to enclose said common bulkhead structure in addition to equipment shareable by said different units mounted in said number of abutting equipment housings, said common bulkhead structure including a plurality of hinged swing out sections, each section including a number of cutouts for receiving a corresponding number of connectors for ease of access in changing external and internal cable connector connections, the internal cable connectors being arranged within said sections so as to enable the equal distribution of the amount of excess cable length in said cables received from said first and second cable raceway members.

12. The system of claim 10 wherein said common equipment housing further includes an auxiliary bulkhead positioned at the rear of said housing, said bulkhead having a plurality of connector cutouts for retaining connectors of said cables received from said first and second cable raceway members for connections to auxiliary equipment utilized by said system, and said bulkhead being connected to swing out in a vertical direction for ease of accessing said connectors.

* * * * *